(12) United States Patent
Berk (10) Patent No.: US 9,898,054 B2
(45) Date of Patent: Feb. 20, 2018

(54) NEAR ZERO FORCE GROUNDING FEATURE

(71) Applicant: Apple Inc., Cupertino, CA (US)

(72) Inventor: Jonathan L. Berk, Mountain View, CA (US)

(73) Assignee: Apple Inc., Cupertino, CA (US)

(*) Notice: Subject to any disclaimer, the term of this patent is extended or adjusted under 35 U.S.C. 154(b) by 45 days.

(21) Appl. No.: 15/043,326

(22) Filed: Feb. 12, 2016

(65) Prior Publication Data

US 2017/0235345 A1    Aug. 17, 2017

(51) Int. Cl.
*G06F 1/18* (2006.01)
*G06F 1/16* (2006.01)

(52) U.S. Cl.
CPC ............ *G06F 1/182* (2013.01); *G06F 1/1615* (2013.01)

(58) Field of Classification Search
CPC .......... H01L 2924/181; H01L 51/0048; B29C 45/0013; B29C 47/0021; B29C 65/02; H05K 2201/0281; H05K 3/107; H05K 9/0015; H05K 2201/029; H05K 1/038; H05K 3/321; H05K 9/0098; H05K 9/0016; H05K 9/0084; H05K 9/0081; H05K 9/0083; H05K 1/0215; H05K 1/0366; H05K 1/0393; H05K 2201/0278; G06F 3/0202; G06F 1/182; G06F 1/1615
See application file for complete search history.

(56) References Cited

U.S. PATENT DOCUMENTS

| | | | |
|---|---|---|---|
| 6,348,654 B1 | 2/2002 | Zhang et al. | |
| 7,687,725 B2* | 3/2010 | Hogan | H05K 9/0009 174/367 |
| 7,910,839 B2* | 3/2011 | Lynam | H05K 9/0009 174/369 |
| 8,173,911 B2* | 5/2012 | Hughes | H05K 9/0045 174/369 |
| 2002/0185292 A1 | 12/2002 | Ariel | |
| 2006/0260838 A1* | 11/2006 | Ariel | H05K 9/0015 174/350 |
| 2011/0194267 A1* | 8/2011 | Sun | H05K 9/0015 361/807 |
| 2013/0333919 A1* | 12/2013 | Nguyen | H05K 9/0015 174/126.1 |

(Continued)

*Primary Examiner* — Adam B Dravininkas
(74) *Attorney, Agent, or Firm* — Downey Brand LLP (57) ABSTRACT

An electronic device can include first and second housing components and an electrical grounding feature located therebetween to provide a grounding path. The grounding feature can include an outer portion formed from an electrically conductive material and an internal region containing a removable expansion element. The grounding feature can exert an expansion force against the housing components when the device is assembled and the expansion element remains, and exert no expansion force against the housing components when the expansion element is removed. The device can also include an adhesive coupling the electrical grounding feature to the housing components, which adhesive can be electrically conductive. The expansion element can be deformable and removable from an open end of the grounding feature outer portion, which outer portion can be elastic and can deform to contact more of the housing components when the grounding feature is compressed therebetween.

20 Claims, 10 Drawing Sheets

(56) References Cited

U.S. PATENT DOCUMENTS

| | | | |
|---|---|---|---|
| 2013/0335285 A1* | 12/2013 | Tarkington | H05K 9/00 343/841 |
| 2014/0112511 A1* | 4/2014 | Corbin | H05K 9/006 381/333 |
| 2014/0133116 A1* | 5/2014 | Matano | H05K 1/0213 361/760 |
| 2014/0216806 A1* | 8/2014 | Poulsen | H05K 9/0015 174/351 |
| 2014/0233169 A1 | 8/2014 | Hobson et al. | |
| 2014/0262471 A1* | 9/2014 | Cook | H05K 9/0015 174/356 |

* cited by examiner

NEAR ZERO FORCE GROUNDING FEATURE

FIELD

The described embodiments relate generally to grounding for computing devices. More particularly, the present embodiments relate to grounding features used to electrically couple housing components of a computing device.

BACKGROUND

Computing devices often have housings that provide protection for internal components within the housing. These internal components can include processors and memories that can be sensitive to electric discharges originating from outside the housing enclosure.

SUMMARY

This paper describes various embodiments that relate to forming a ground path between housing components of a computing device. According to various embodiments, an electronic device can include housing components and an electrical grounding feature located therebetween to provide a grounding path. The grounding feature can include an outer portion formed from an electrically conductive material and an internal region containing a removable expansion element. The grounding feature can exert an expansion force against the housing components when the device is assembled and the removable expansion element remains, and exert zero to near zero expansion force against the housing components when the removable expansion element is removed.

In some embodiments, the device can also include an adhesive coupling the electrical grounding feature to the housing components, which adhesive can be electrically conductive and can also be a pressure sensitive adhesive (PSA). The removable expansion element can be deformable and removable from an open end of the grounding feature outer portion, which outer portion can be elastic and can deform to contact more of the housing components when the grounding feature is compressed therebetween. The removable expansion element can be a foam material, or can be a fluid, such as a compressible gas or incompressible liquid.

In various embodiments, methods of forming a computing device can include exerting a significant compressive force on a grounding feature located between housing components, wherein the compressive force facilitates coupling the grounding feature and housing components via a conductive PSA, and removing an expansion element from an interior region of the grounding feature, resulting in a ground path being formed between the housing components and a near zero expansion force being exerted against the housing components by the grounding feature.

This Summary is provided merely for purposes of summarizing a few exemplary embodiments to provide a basic understanding of some aspects of the disclosed subject matter. Accordingly, it will be appreciated that these features are merely examples, and should not be construed to narrow the scope or spirit of the subject matter in any way. Other features, aspects, and advantages will become apparent from the following description, figures, and claims.

BRIEF DESCRIPTION OF THE DRAWINGS

The included drawings are for illustrative purposes and serve only to provide examples of possible structures and methods for the disclosed electronic devices having near zero force grounding features. These drawings in no way limit any changes in form and detail that may be made to the embodiments by one skilled in the art without departing from the spirit and scope of the embodiments. The disclosure will be readily understood by the following detailed description in conjunction with the accompanying drawings, wherein like reference numerals designate like structural elements.

DETAILED DESCRIPTION

This disclosure relates to structures and methods for electrically coupling components of a computing device. In particular, an electrical grounding feature can provide an electrical ground path for one or more components of a computing or other electronic device. This can involve electrically coupling housing components of the electronic device. In some embodiments, electrically coupled conductive housing components can form a conductive shell, or Faraday cage, that electrically isolates an interior volume or cavity defined by the joined housing components. The Faraday cage can reduce unwanted interference from electromagnetic radiation outside the housing, as well as reduce emission of unwanted electromagnetic radiation from electrical sources within the interior volume. While contact between conductive housing components offers some amount of electrical coupling, this connection can be inadequate and degrade over time, reducing the effectiveness of the formed Faraday cage and ground path. To improve the stability and efficiency of an electrical coupling or ground path, the grounding feature can be secured between the housing components.

Unfortunately, housing assemblies that are secured using a constant compressive force exerted between the housing components can degrade a compressed grounding feature over time. Such degradation can result in bond performance issues if a PSA is used to assemble the housing components, as well as offset problems for fasteners used to attach the housing components. Further, fastener openings in a housing component can be visible to a user of the computing device, and provide an ingress path for moisture to enter the interior volume of the joined housing components that can damage sensitive electrical components within the housing.

One way to electrically couple housing components without a constant compressive force is to use an electrical grounding feature that exerts a near zero expansion force against the assembled housing components. In some embodiments, the electrical grounding feature can include an outer portion formed from an electrically conductive material and an internal region containing a removable expansion element. The conductive outer material can change shape between an expanded state and a relaxed state For clarity of the description, the electrical grounding feature can be referred to as a grounding gasket; however, this does not limit the scope of the embodiments. In addition, it will be understood that the terms ground path and grounding as used herein refer to an electrical ground path and electrical or electrically grounding.

In some embodiments, the grounding gasket or other grounding feature can be stacked between housing components during assembly of the computing or other electronic device. A significant compressive force can be applied to the housing components, causing a conductive outer material of the grounding gasket to contact the housing components, and whereby the grounding gasket correspondingly exerts a significant expansion force against the housing components. The significant compressive and expansion forces can be on the order of about 5-30 psi, for example, although other significant non-zero force amounts are also contemplated. In some embodiments, an expansion element within the conductive outer material can resist the compressive force, exerting a pressure on a region between the grounding gasket and the housing components. A layer of a conductive medium can be distributed within the pressure region. In some embodiments, the conductive medium is a PSA, and the pressure can activate adhesion properties of the conductive PSA, adhering the conductive outer material to the housing components.

The expansion element can be removed from the adhered conductive outer material to allow the grounding gasket to enter a relaxed, or collapsed state. In some embodiments, the expansion element can be removed from an exposed portion of the grounding gasket that is accessible from the exterior of the assembled housing components. Removal of the expansion element allows the conductive outer material to relax and exert a zero or near zero expansion force between the housing components while maintaining adhesion to the housing components. The adhered conductive outer material of the grounding gasket can form a ground path between the housing components, thus forming an effective Faraday cage from the housing components.

In some embodiments, the conductive outer material of the grounding gasket is formed from a conductive flexible fabric. The flexible fabric can form a tube having an interior region that can retain an expansion element. A distal end of the tube can be configured to allow removal of the expansion element from the interior region. In some embodiments, the conductive flexible fabric can be formed of a non-conductive flexible fabric having a conductive coating. In alternative embodiments, conductive material, such as metal, is woven into a flexible fabric material forming a flexible conductive fabric. In some embodiments, the conductive outer material can be formed of a material that contracts with the removal of the expansion element from the interior region, thus exerting a contraction force between the housing components.

The removable expansion element can define a shape of the grounding gasket when retained within the interior region of the conductive outer material. In some embodiments, the removable expansion element can be formed of a material that is rigid, or semi-rigid, such that the grounding gasket substantially maintains its shape when a compressive force is exerted on the grounding gasket. In some embodiments, a semi-rigid expansion element can partially deform when subjected to a compressive force. This deformation can control the pressure exerted on layers a conductive medium located between the grounding gasket and the housing components. Further, this deformation can cause the conductive outer material to conform to contact surfaces of the housing components, increasing a contact surface area between the housing components and the grounding feature. This increase surface area can provide greater adhesion and conductivity between the grounding feature and the housing components through the layers of conductive medium. As a result, an efficient and stable ground path and Faraday cage can be formed between the housing components.

In some embodiments, the expansion element can be removed during assembly of the computing device through a distal end of the grounding feature that may be accessible from the exterior of the assembled computing device. In some embodiments, an end of a conductive outer material of the grounding feature can be exposed to, or extend from, an exterior surface of a housing component. The exposed end can allow for removal of the expansion element during assembly, or, alternatively, when the computing device is fully assembled. In some embodiments, the expansion element can be formed of a pliable material such as closed cell foam that allows for removal from the conductive outer material of the grounding feature. In other embodiments, the expansion element can be a compressible or non-compressible fluid such as air or water. The conductive outer material can be chosen to retain the expansion element, and the arrangement of the conductive outer material within the housing can be chosen to allow for removal of the expansion element. For example, the conductive outer material can be an inflatable conductive fabric that retains compressed air as the expansion element. Further, routing of the grounding feature can take into consideration friction during the removal of the expansion element, and in some embodiments, curvature of the grounding feature is minimized.

These and other embodiments are discussed below with reference to FIGS. 1-9. However, those skilled in the art will readily appreciate that the detailed description given herein with respect to these Figures is for explanatory purposes only and should not be construed as limiting.

Figure 1A:
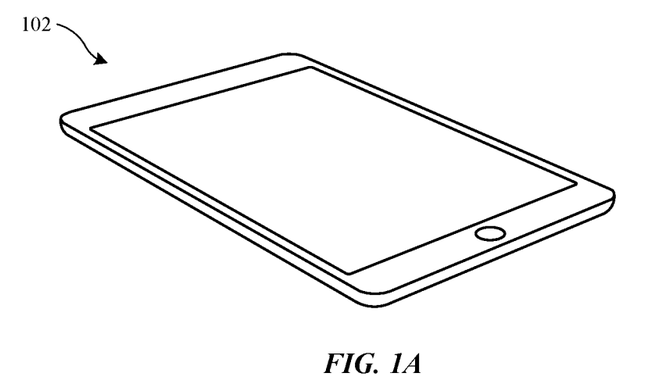
FIGS. 1A-1C illustrate in front perspective views various exemplary computing devices that can incorporate the grounding features disclosed herein according to various embodiments of the present disclosure.
Figure 1B:
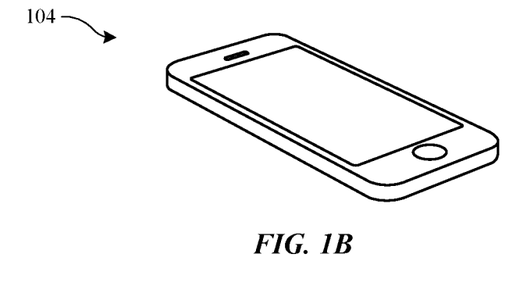
Figure 1C:
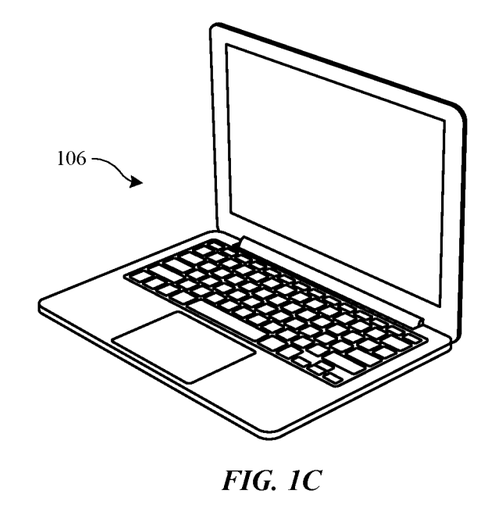

FIGS. 1A-1C show various computing devices that can utilize the apparatuses described herein. FIG. 1A shows tablet computer 102, FIG. 1B shows portable phone 104, and FIG. 1C shows portable computer 106. Tablet computer 102, portable phone 104, and portable computer 106 can each include housings. The housings can be made of electrically conductive material such as metal, or have metal portions.

The conductive material can include steel, iron, copper, carbon fiber, aluminum, and/or any other conductive materials suitable for housing components of a computing device. In some embodiments, the conductive material can be formed of aluminum, and more specifically anodized aluminum. Electrically conductive housings can provide electric isolation and grounding protection to electronic components within an internal volume defined by the housing components. For example, electrically conductive housings can provide protection to internal components from external sources of electrical discharges by providing a conductive shell, or Faraday cage, for the internal components. Additionally, electrically conductive housings can provide electromagnetic shielding from electromagnetic noise (often referred to as electromagnetic radiation, or EMI) emitted from components within the computing device.

Tablet computer 102, portable phone 104, and portable computer 106 can each include multi-part housings. A ground path between housing components of the multi-part housings can provide a ground path between the housing components.

Figure 2:
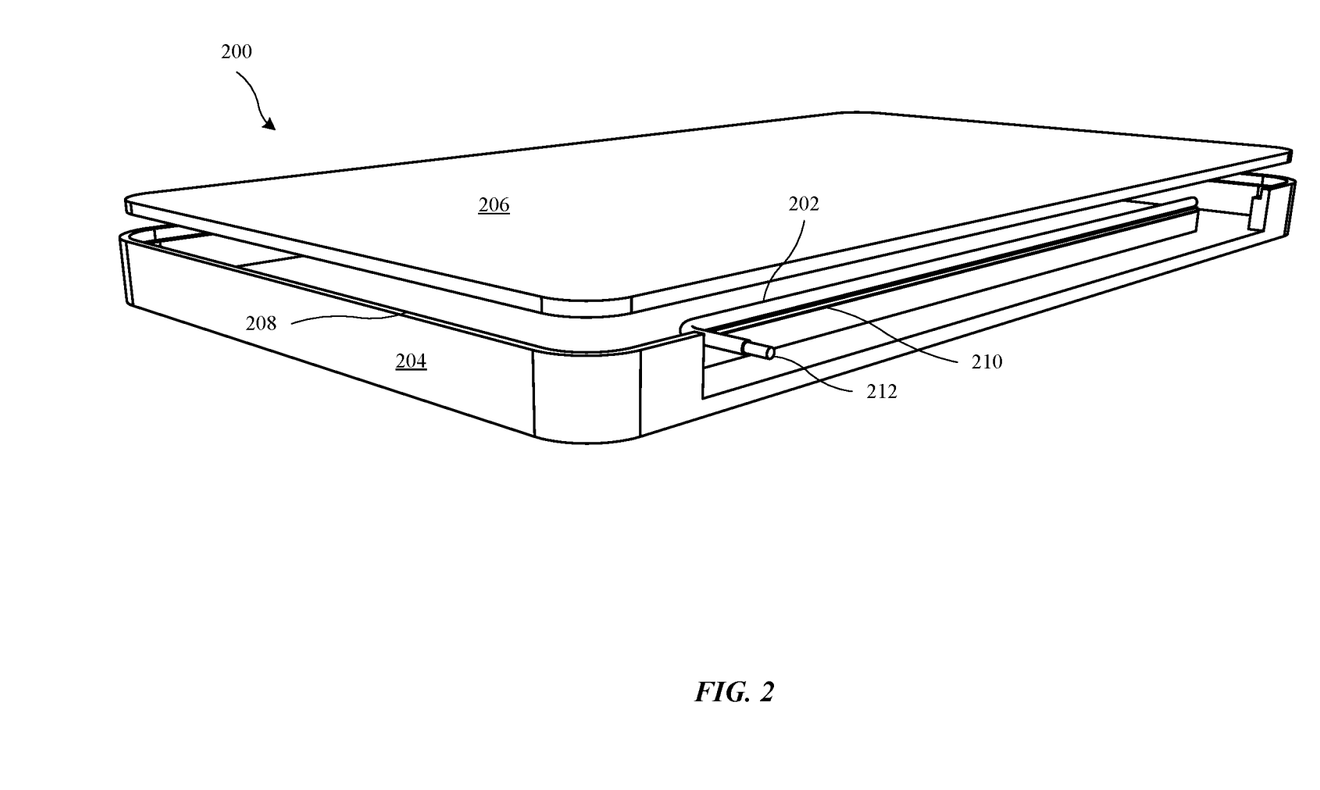
FIG. 2 illustrates in front perspective view an exemplary computing device housing and grounding feature according to various embodiments of the present disclosure.

A grounding feature can be located between housing components of the computing device to decrease a resistance of the grounding path and improve the stability of the grounding path over time. FIG. 2 shows a perspective view of computing device housing 200 and grounding feature 202. Computing device housing 200 can include bottom housing component 204 and cover 206. It will be readily appreciated that computing device housing 200 can form an outer housing enclosing an internal volume or cavity for an associated computing device, and that forming the computing device housing 200 is part of forming the computing device. Furthermore, it will be understood that while the terms "bottom housing component" and "cover" are used herein to denote housing components for an electronic device, that any other suitable housing components and arrangement thereof could alternatively be used in place of such a bottom housing component and cover. Bottom housing component 204 and cover 206 can both be formed of an electrically conductive material, such as aluminum. Bottom housing component 204 and cover 206 can collectively define an internal volume 208 or cavity that can house electronic components, such as processors, memories, displays, and/or any other electrical component suitable for including in a computing or other electronic device. Cover 206 can be configured to cover an opening in internal volume 208. Bottom housing component 204 can further include mounting surface 210 that is configured to support grounding feature 202. A layer of a conductive medium (not shown) can be located between grounding feature 202 and mounting surface 210. In some embodiments, the conductive material can be an electrically conductive PSA. Another layer of a conductive medium can be located on a surface (not shown) of cover 206 aligned with grounding feature 202.

Grounding feature 202 and mounting surface 210 can be arranged within internal volume 208 to facilitate the grounding of internal components. This can also provide for the formation of an effective Faraday cage. For example, grounding feature 202 can be located proximate to internal components, such as processors, which can be sensitive to electromagnetic radiation. In some embodiments, grounding feature 202 can be located along an edge of internal volume 208. In some embodiments, bottom housing component 204 and cover 206 can define an opening (not shown). Grounding feature 202 and mounting surface 210 can be recessed within the internal volume such that some internal components that emit or receive electromagnetic radiation, such as antennas, can be located proximate the opening. The antennas can emit or receive electromagnetic radiation through the opening, while the Faraday cage formed by bottom housing component 204 and cover 206 provides electromagnetic (EM) isolation to a remainder of the internal volume 208. In further embodiments, grounding feature 202 can be located around a periphery of internal volume 208, between bottom housing component 204 and cover 206.

The location of grounding feature 202 can also facilitate the removal of an expansion element 212 during the assembly of computing device housing 200. A distal end of grounding feature 202 may extend towards or through an opening of computing device housing 200, such that expansion element 212 can be removed from the grounding feature 202 and computing device housing 200 during assembly. In some embodiments, an end of grounding feature 202 can extend to an exterior of computing device housing 200. In alternative embodiments, an end of grounding feature 202 can be recessed within computing device housing 200 and still be accessible during assembly of computing device housing 200. Grounding feature 202 can also have a shape that facilitates the removal of expansion element 212. When expansion element is a solid, grounding feature 202 can be relatively straight with minimal curvature. When expansion element 212 is a pliable solid, such as foam, grounding feature 202 can have a shape that does not prevent or impede removal of expansion element 212. Alternatively, when expansion element 212 is a fluid, grounding feature 202 can take a more complex design, provided the shape does not restrict the flow of the fluid. In some embodiments, a single grounding feature 202 can be routed around a periphery of internal volume 208. In further embodiments, multiple grounding features 202 can be arranged around the periphery of internal volume 208, each grounding feature having an end that is accessible from an exterior of computing device housing 200.

Figure 3A:
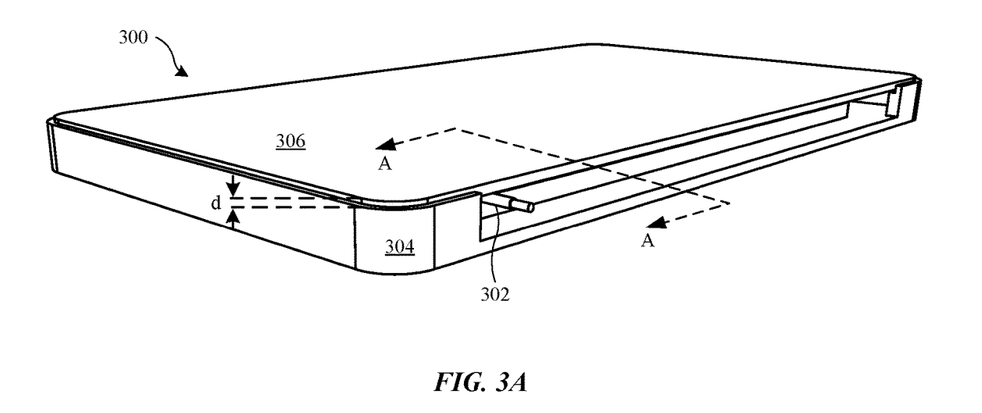
FIG. 3A illustrates in front perspective view of an exemplary computing device housing and grounding feature during assembly according to various embodiments of the present disclosure.

FIG. 3A shows a perspective view of a computing device housing 300 with an electrical grounding feature 302. During assembly, grounding feature 302 can be located between bottom housing component 304 and cover 306 of computing device housing 300. Grounding feature 302 can be stacked between bottom housing component 304 and cover 306 such that cover 306 is offset a distance "d" from a desired final alignment. Layers of PSA (not shown) can be located between grounding feature 302 and a contact surface of bottom housing component 304, and between grounding feature 302 and a contact surface of cover 306. In some embodiments, the PSA is electrically conductive, and prior to the application of a compressive force, the conductive PSA can be inactivated. The PSA in an inactivated state can be non-adhering, and can become adhering upon activation through pressure.

Figure 3B:
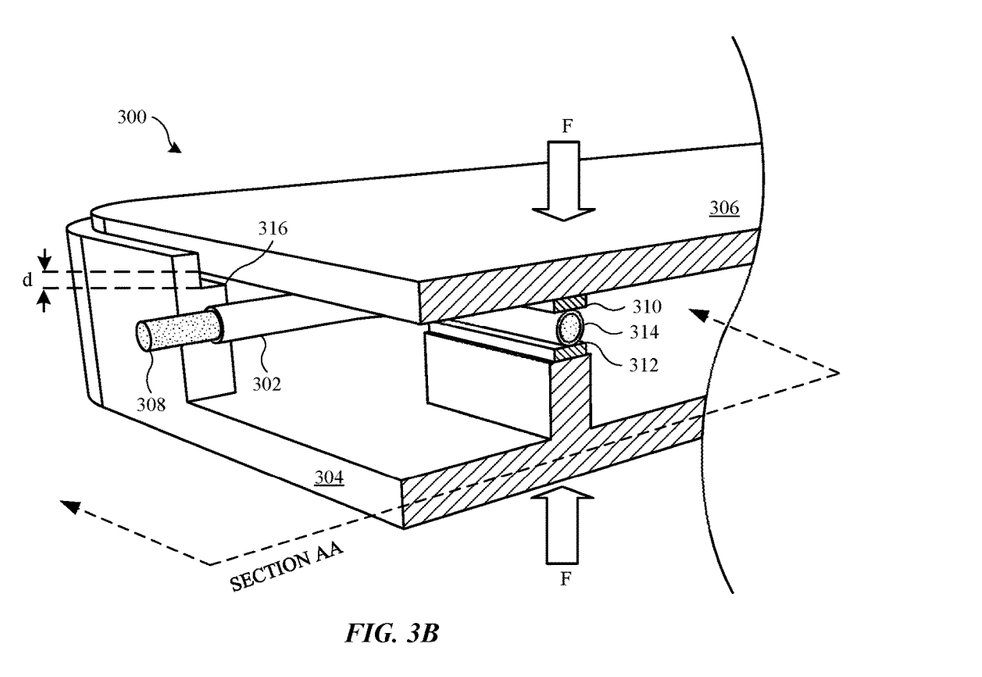
FIGS. 3B-3C illustrate in front perspective and partial cross-sectional views an exemplary computing device housing and grounding feature during assembly according to various embodiments of the present disclosure.
Figure 3C:
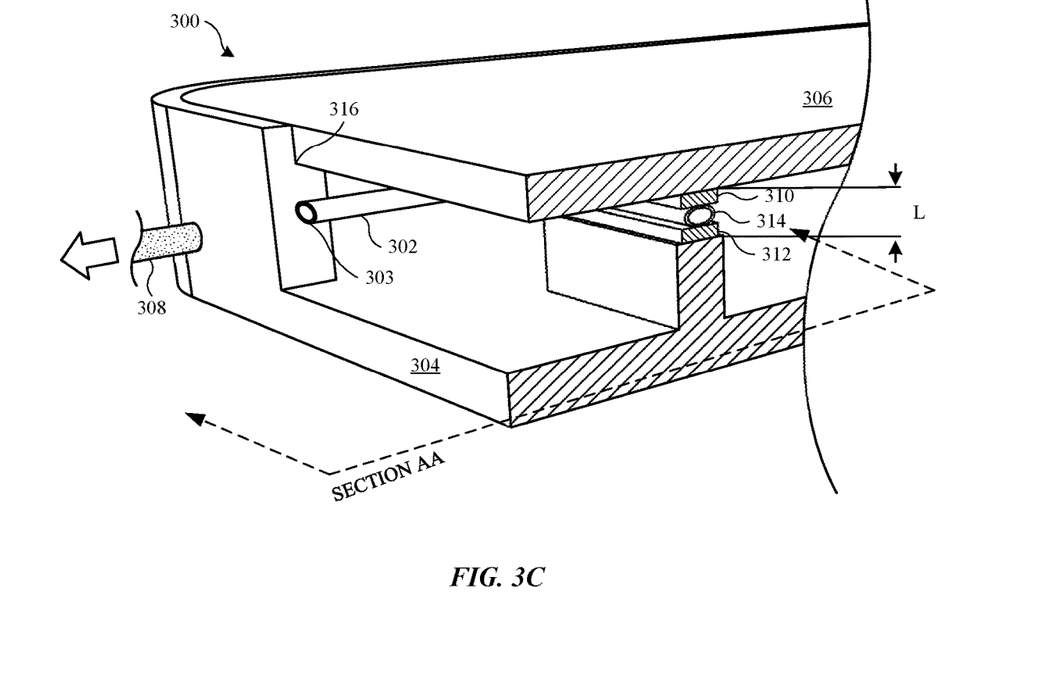

FIGS. 3B-3C show perspective and partial cross-sectional views of computing device housing 300 and grounding feature 302 during assembly. A compressive force can be applied to computing device housing 300 as shown in FIG. 3B, which illustrates a perspective and partial cross-sectional view of computing device housing 300 taken along line A-A of FIG. 3A. A significant compressive force "F" exerted between bottom housing component 304 and cover 306 can act on grounding feature 302 and conductive medium layers 310 and 312 (not drawn to scale). Again, this significant compressive force can be on the order of about 5-30 psi, for example. In some embodiments, conductive medium layers 310 and 312 can be formed of PSA. Adhesion properties of PSA layers 310 and 312 can be activated by pressure. Grounding feature 302 can include an expansion element 308 retained within a conductive outer portion 314, which expansion element 308 can be removable in some embodiments. Expansion element 308 can resist compressive force "F," such as by exerting a significant expansion force to counteract the compressive force, with the compressive and expansion forces thereby exerting a pressure on conductive PSA layers 310 and 312. The pressure can cause conductive PSA layers 310 and 312 to activate and flow, or wet out, contact regions on conductive outer portion 314 where conductive outer portion 314 contacts bottom housing component 304 and cover 306 at respective contact surfaces thereof. The wetted out PSA can flow between and cover the contact surfaces to maximize the contact area and increase the attractive forces between the PSA and the bonding surfaces of the conductive outer portion 312, the bottom housing component 304, and the cover 306.

Expansion element 308 can be formed of rigid or semi-rigid materials. In some embodiments, expansion element 308 is formed of a pliable material such as closed cell foam. Semi-rigid materials, such as closed cell foam, can allow for some compression and deformation of expansion element 308 when subjected to compressive force "F." This deformation can cause conductive outer portion 314 to conform to the contact surfaces of bottom housing component 304 and the contact surfaces of cover 306. The conformation of conductive outer portion 314 can increase the surface area of the contact regions, and provide greater adhesion between conductive outer portion 314 and bottom housing component 304, and also between conductive outer portion 314 and cover 306. The greater adhesion can improve the stability of the grounding path over time, preventing unwanted separation of grounding feature 302 from bottom housing component 304 and cover 306.

While pressure exerted on PSA layers 310 and 312 activates the adhesive properties of the PSA, it may be desirable to maintain the exerted pressure under a threshold pressure level. Above this threshold pressure level, PSA layers 310 and 312 can flow away from contact areas between conductive outer portion 314 and bottom housing component 304, and also between conductive outer portion 314 and cover 306. The reduced presence of PSA in the contact region can reduce the adhesion of the conductive outer portion 314, thus reducing the stability and effectiveness of the formed Faraday cage. In some embodiments, the deformation of expansion element 308 during compression of computing device housing 300 can control the pressure exerted on PSA layers 310 and 312. Above a desired compressive force "F," cover 306 can move a distance "d" and seat against a seating surface 316 of bottom housing component 304. When seated, additional force beyond that which can be required to move cover 306 a distance "d" is transferred through seating surface 316 and is not directed into the PSA layers. Expansion element 308 can be removed from grounding feature 302 when conductive outer portion 314 is adhered to bottom housing component 304 and cover 306.

FIG. 3C shows a perspective and partial cross-sectional view of computing device housing 300 and grounding feature 302 taken along line A-A of FIG. 3A. Expansion element 308 can be removed from an accessible end of grounding feature 302. In some embodiments, an accessible distal end 303 of grounding feature 302 is exposed via an opening in computing device housing 300. Expansion element 308 can be pulled through the accessible distal end 303 of grounding feature 302, leaving conductive outer portion 314 behind as the only remaining part of grounding feature 302. Conductive outer portion 314 can be formed of a flexible conductive material that does not exert a significant expansion force between bottom housing component 304 and cover 306 when the expansion element 308 has been removed. Accessible distal end 303 of grounding feature 302 can be moved or trimmed after removal of expansion element 308. In some embodiments, accessible distal end 303 of grounding feature 302 can be tucked into an opening of computing device housing 300 after removal of expansion element 308.

Removal of expansion element 308 from grounding feature 302 allows remaining conductive outer portion 314 to enter a collapsed state while maintaining a ground path between bottom housing component 304 and cover 306 through conductive PSA layers 310 and 312. When computing device housing 300 is in an assembled state, a distance "L" between a contact surface of bottom housing component 304 and a contact surface of cover 306 can be greater than a thickness of conductive outer portion 314 in a fully relaxed state, thus preventing stacking of conductive outer portion 314 between housing components. In some embodiments, cover 306 can seat against a seating surface 316 of bottom housing component 304, thereby preventing stacking of grounding feature 302 when computing device housing 300 is in an assembled state.

Figure 4:
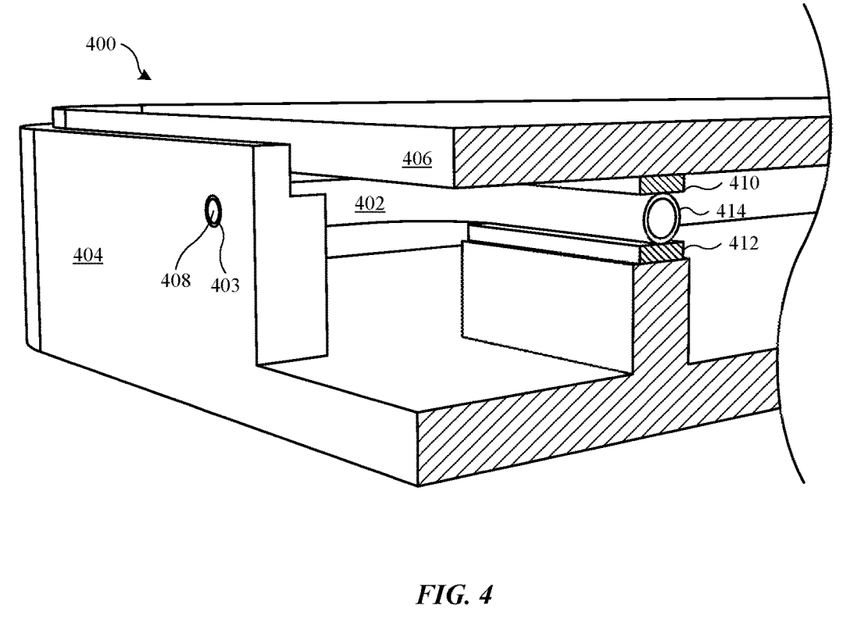
FIG. 4 illustrates in front perspective and partial cross-sectional view an exemplary computing device housing and fluid filled grounding feature according to various embodiments of the present disclosure.

In some embodiments, expansion element 308 is a fluid. The fluid can be non-compressible such as a liquid, or compressible such as a gas. FIG. 4 shows a perspective and partial cross-sectional view of a computing device housing 400 having a fluid filled grounding feature 402. Conductive outer portion 414 of grounding feature 402 can act as a fluid barrier that retains the fluid when a compressive force is exerted on the bottom housing component 404 and cover 406. The compressive force can increase a pressure of the fluid within grounding feature 402. The fluid pressure within grounding feature 402 can resist the compressive force exerted on the bottom housing component 404 and cover 406, such as where the grounding feature 402 correspondingly exerts a significant expansion force against the housing components. In some embodiments, conductive outer portion 414 can be semi-permeable, and fluid within the interior of a tube defined by conductive outer portion 414 can flow out through the semi-permeable conductive material that forms the outer portion 414. In further embodiments, portions, such as an end, of grounding feature 402 can include fluid-permeable regions that can allow pressurized fluid to escape. The fluid can act as a deformable expansion element that causes conductive outer portion 414 to conform to contact surfaces of bottom housing component 404 and cover 406. The fluid can also maintain a desired pressure exerted on the contact surfaces and the conductive layers of PSA 410 and 412 located on the contact surfaces. In some embodiments, contact surfaces of bottom housing component 404 and cover 406 can have a surface geometry at the contact region to increase adhesion to grounding feature 402. This surface geometry can include roughening to increase an area of the contact region.

A constant flow of fluid through grounding feature 402 can maintain a desired pressure within the grounding feature 402 to resist a compressive force exerted on the bottom housing component 404 and cover 406. Fluid can be forced into the grounding feature 402 at a greater rate than a permeation rate of fluid through the grounding feature 402, resulting in a pressure buildup within the grounding feature 402. As the pressure increases, the permeation rate of fluid through conductive outer portion 414 can increase and approach the intake fluid rate, resulting in an equalized or constant fluid pressure within grounding feature 402. In further embodiments, grounding feature 402 is sealed and the fluid pressure within grounding feature 402 can increase with the applied compressive force. The pressure within grounding feature 402 can also be maintained by an input source that provides the fluid. The fluid input source can include, for example, an air compressor or other suitable device that can maintain a desired pressure, and that has provisions for interfacing with the grounding feature 402.

In some embodiments, grounding feature 402 can be accessible from an exterior of the computing device, such as through a fluid valve 408. Fluid valve 408 can extend through an opening 403 in computing device housing 400. In some embodiments, fluid valve 408 can extend through a portion of bottom housing component 404. Fluid valve 408 can have a smaller diameter than grounding feature 402, and be configured to accept a needle (not shown) for injecting a fluid into grounding feature 402 during assembly of computing device housing 400. Fluid valve 408 can include a sealing feature, such as a gasket (not shown), to prevent the fluid from escaping around the injection needle. Fluid valve 408 can allow fluid to escape grounding feature 402 during assembly of computing device housing 400 when the injection needle is removed from fluid valve 408. Fluid valve 408 can also be used to separate cover 406 from bottom housing component 404 in some embodiments.

In some embodiments, cover 406 can be coupled to bottom housing component 404 without the use of exterior fasteners. Cover 406 can thus lack exterior provisions for grasping cover 406 and separating it from bottom housing component 404. Grounding feature 402 can act as a pneumatic lift for separating bottom housing component 404 from cover 406. Fluid can be injected into grounding feature 402 through fluid valve 408 to exert a pressure resulting in an expansion force against cover 406 and bottom housing component 404. This pressure can expand grounding feature 402 and separate cover 406 from bottom housing component 404, exposing a portion of cover 406 that can be grasped, allowing for removal of cover 406.

Figure 5A:
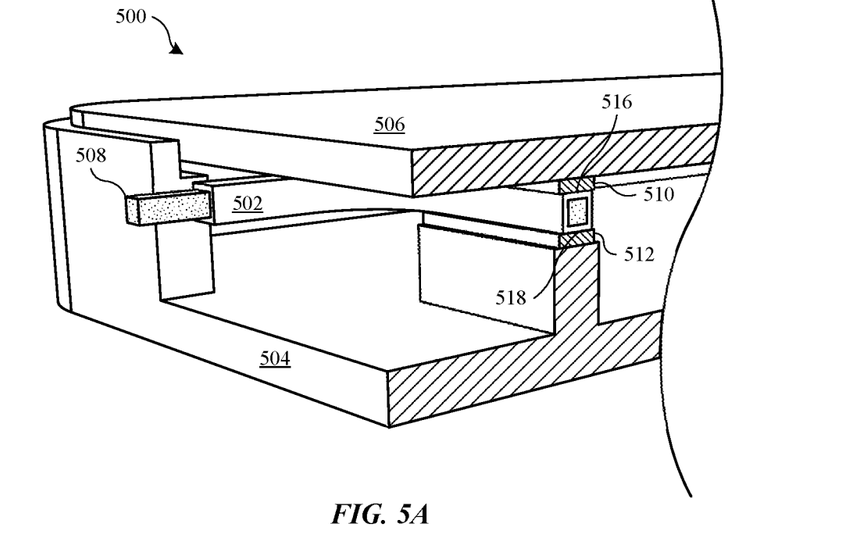
FIGS. 5A-5B illustrate in front perspective and partial cross-sectional views an exemplary alternative computing device housing and non-cylindrical grounding feature according to various embodiments of the present disclosure.
Figure 5B:
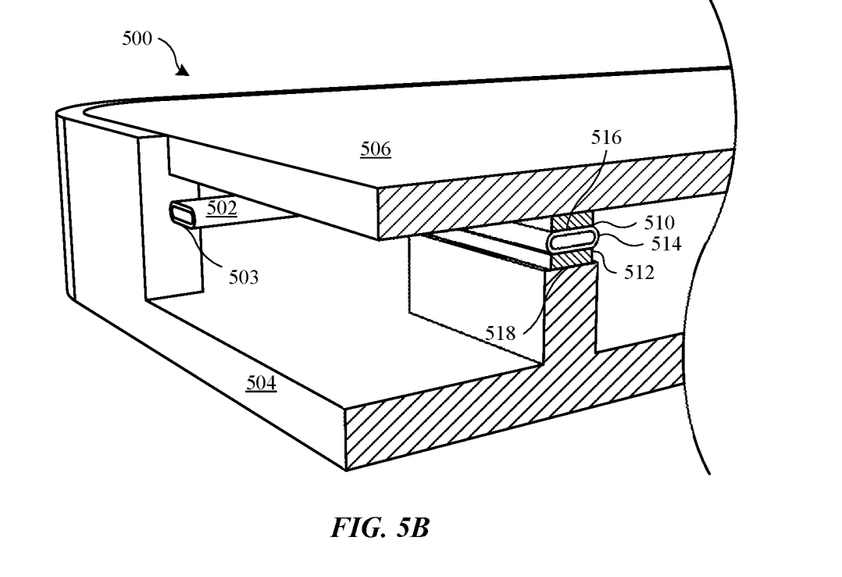

FIGS. 5A-5B show perspective and partial cross-sectional views of a computing device housing 500 and non-cylindrical grounding feature 502. In some embodiments, grounding feature 502 can form a tube having a uniform cross-sectional shape along the length of the tube. In alternative embodiments, grounding feature 502 can have a cross-sectional shape and/or area that tapers along the length of the grounding feature 502 away from an exposed end 503 of the grounding feature 502. The tapering of the cross-sectional area can ease removal of expansion element 508 during assembly of computing device 500.

The cross-sectional shape of grounding feature 502 can be chosen to increase wetting out and activation of PSA layer 510 and PSA layer 512 over contact surface 516 and contact surface 518 of grounding feature 502. Grounding feature 502 can have a shape such that contact surfaces 516 and 518 conform to corresponding contact surfaces of bottom housing component 504 and cover 506. In some embodiments, contact surfaces of bottom housing component 504 and cover 506 are substantially flat, while contact surfaces 516 and 518 of grounding feature 502 can be correspondingly substantially flat. In some embodiments, grounding feature 502 can have a rectangular cross-sectional shape, the shape defined and maintained by expansion element 508. Removal of expansion element 508 allows conductive outer component 514 to enter a relaxed or collapsed state, as shown in FIG. 5B. Contact surfaces 516 and 518 of grounding feature 502 can be coated with a wetted out conductive PSA 510, 512, which helps to form a ground path between bottom housing component 504 and cover 506.

Figure 6:
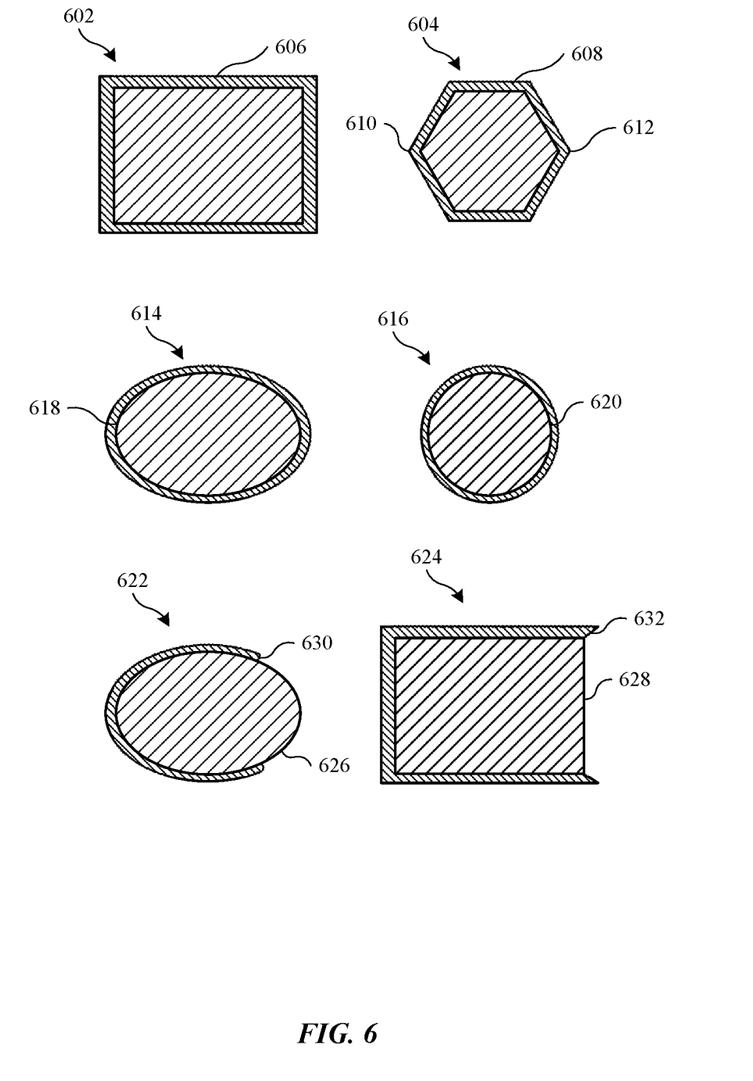
FIG. 6 illustrates in cross-sectional view various exemplary grounding features according to various embodiments of the present disclosure.

FIG. 6 shows cross-sections of various exemplary grounding features, including polygon cross-sectional shaped grounding features 602 and 604. Substantially flat contact surfaces 606 and 608 of polygon grounding features 602 and 604 can provide a substantially flat contact areas that are flush with contact surfaces of a computing device housing. A flush contact area can facilitate wet out of layers of PSA between grounding features 602 and 604, and reduce a contact resistance between the housing components and grounding features 602 and 604. Polygon grounding feature 604 can have can have corners 610 and 612 that are not in contact with the housing components. Corners 610 and 612 can facilitate the collapse of polygon grounding feature 604 by providing structural collapse regions for sidewalls of polygon grounding feature 604.

FIG. 6 also includes exemplary elliptical cross-sectional shaped grounding features 614 and 616. The elliptical shape can decrease a removal resistance associated with removing expansion elements 618 and 620 from grounding features 614 and 616 respectively. Similarly, open sided grounding features 622 and 624 can decrease a removal resistance associated with removing expansion elements 626 and 628 respectively. Grounding features 622 and 624 can define sidewall openings 630 and 632. Sidewall openings 630 and 632 can run along the length of grounding features 622 and 624 respectively. Expansion elements 626 and 628 can be removed through sidewall openings 630 and 632 respectively, rather than, or in addition to, removal at a distal end of the grounding features.

Figure 7:
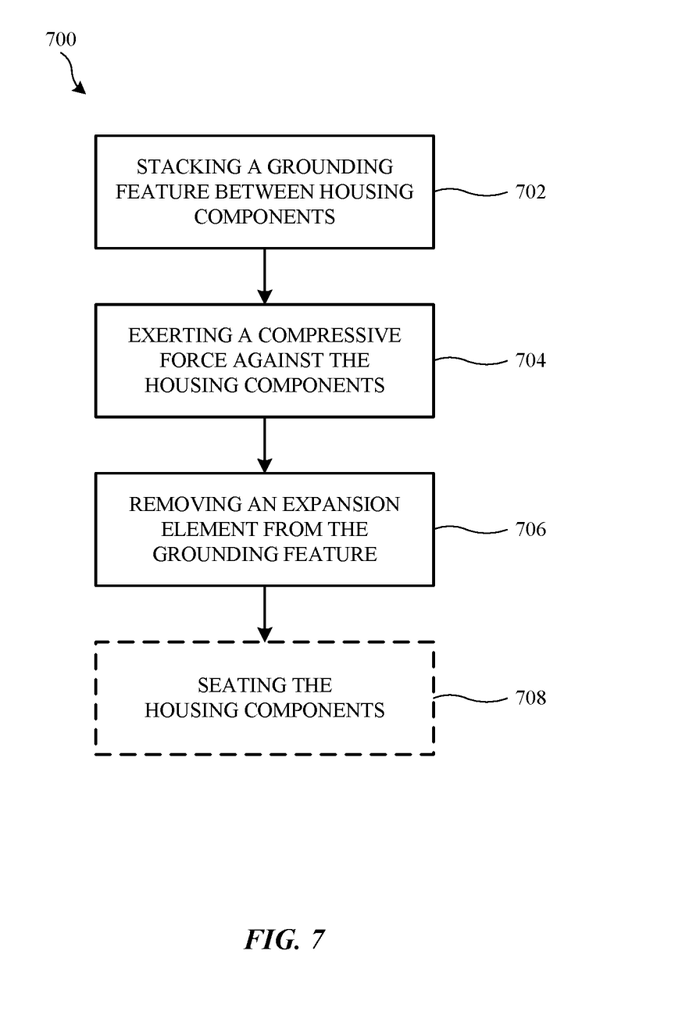
FIG. 7 shows a flow diagram describing an exemplary method for forming a ground path between housing components according to various embodiments of the present disclosure.

FIG. 7 shows flow diagram 700 describing an exemplary method for forming a ground path between housing components. In step 702, a grounding feature can be stacked between housing components, such as an upper housing component and a lower housing component. The housing components can be formed of an electrically conductive material such as aluminum. The grounding feature can include a removable expansion element and a conductive outer portion that retains the removable expansion element. In some embodiments, the conductive outer portion can be formed from a material that is a flexible conductive fabric. The fabric can form a tube shape having a desired cross-section. In some embodiments, the cross-section is circular, and in alternative embodiments the cross-section is rectangular. The removable expansion element can be retained in an internal region defined by the outer portion. In some embodiments, a cross-section of the removable expansion element is chosen to fit inside a tube formed by the electrically conductive outer portion. The removable expansion element can be formed of a rigid or semi-rigid material. In some embodiments, the removable expansion element can be formed of foam. The foam can be a closed cell foam that can substantially maintain its shape when under a compressive force.

In step 704, a compressive force can be exerted against the housing components. The compressive force can be a significant force that acts on the housing components and the grounding feature stacked therebetween, which can result in a counteractive significant expansion force from the grounding feature. These compressive and expansion forces can cause a pressure between the grounding feature and the housing components that activates and wets out conductive PSA located between the grounding feature and the housing components. The activated PSA, which can be located at both of the housing components, can adhere the conductive outer portion of the grounding feature to the housing components, thereby helping to form a ground path between the housing components.

In step 706, the removable expansion element can be removed from the grounding feature. The removable expansion element can be removed from an exposed distal end of the grounding feature, for example. A pulling force can withdraw the removable expansion element from the tube formed by the conductive outer portion of the grounding feature. In some embodiments, the removable expansion element can resist tearing under the pulling force. In further embodiments, the expansion element can undergo extension caused by the pulling force. The expansion element can shrink during extension, facilitating the removal of the expansion element from the conductive outer portion. Removal of the expansion element can allow the conductive outer portion to relax, collapse, and/or exert a zero or near zero expansion force against the housing components.

In optional step 708, the housing components can be seated. The final alignment of the housing components can exert no compressive force on the grounding feature. The grounding feature can maintain adhesion to the housing components through the conductive PSA. The grounding feature, in this configuration can exert a zero or near zero expansion force against the housing components, as well as a zero or near zero force planar to the contact surfaces of the housing components. The grounding feature preferably does not drive the x-y alignment of the housing components.

Figure 8:
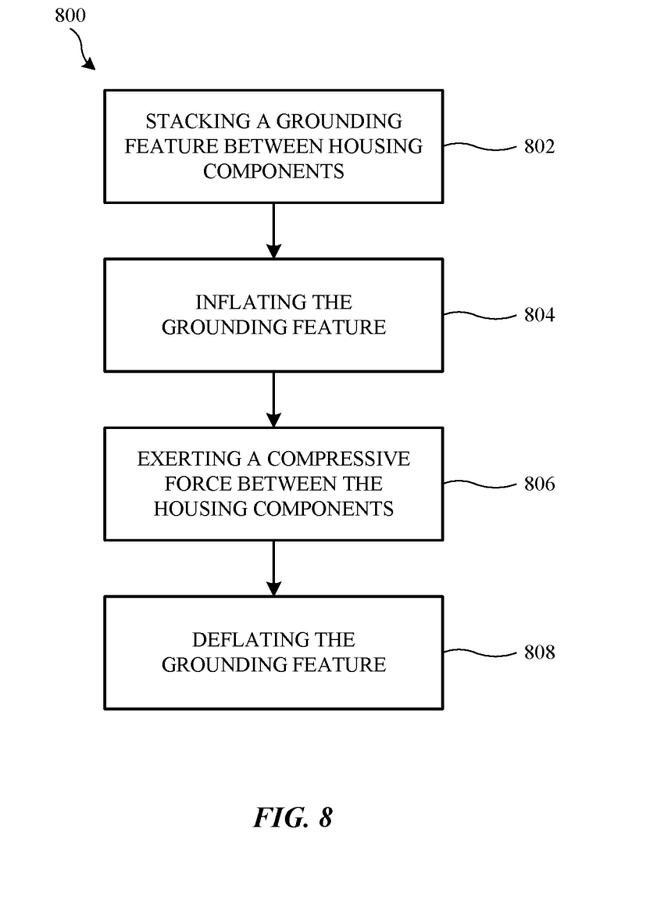
FIG. 8 shows a flow diagram describing an exemplary method for forming a ground path between housing components with a fluid expanded grounding feature according to various embodiments of the present disclosure.

FIG. 8 shows flow diagram 800 describing an exemplary method for forming a ground path between housing components with a fluid expandable grounding feature. In step 802, a grounding feature can be stacked between housing components of a computing device. Conductive layers of PSA can be stacked between the grounding feature and each of the housing components. Again, the housing components can be formed of an electrically conductive material such as aluminum, and the grounding feature can include a conductive outer portion that can be formed from a material that is a flexible conductive fabric. The fabric can form an outer sheath, which may take the shape of a tube having a desired cross-section.

In step 804, a fluid can be injected into the outer sheath of the grounding feature to inflate the grounding feature. In some embodiments, the fluid is a gas such as compressed air. In some embodiments, the fluid can be an incompressible liquid. The outer sheath can include a portion that is permeable to the injected fluid. The permeable portion can be located at an end of the grounding feature opposite an end of the grounding feature that receives the fluid. A permeation rate of the fluid through the gasket can increase with the pressure of the fluid within the outer sheath. An equilibrium can be reached between the injection rate of the fluid and the permeation rate of the fluid through the outer sheath resulting in a constant internal fluid pressure. The internal fluid pressure can expand the grounding feature and cause the grounding feature to be stacked and pressurized between the housing components.

In step 806, a compressive force can be exerted on the housing components. The internal fluid pressure within the outer sheath can resist the compressive force. A conductive layer of PSA between the outer sheath and one or more housing components can be activated and wet out portions of the outer sheath that contact the housing component. The outer sheath can deform under the compressive force increasing the contact portions of the outer sheath. This increased contact portion can increase the adhesion of the outer sheath to each of the affected housing components. The contact resistance between the outer sheath and the housing component can also be reduced because of the increased contact region area. The deformation of the outer sheath can also limit a pressure experienced by the layer of PSA during exertion of the compressive force. Deformation of the outer sheath can allow the housing components to stack, transferring additional compressive force through a stack of the housing components away from the grounding feature. This may be desirable where additional compressive force may damage the grounding feature or cause the layer of PSA to flow away from the contact area.

In step 808, the grounding feature can be deflated. Injection of the fluid can be stopped, and in some embodiments the compressive force presses out the fluid. In alternative embodiments, the fluid can be pumped out of the outer sheath. The outer sheath remains adhered to each of the affected housing components through the conductive PSA, and can relax to a collapsed state. In some embodiments, the outer sheath exerts a zero or near zero expansion force against the housing components. In some embodiments the outer sheath can retract from its expanded shape, exerting a pulling or contraction force between the housing components.

Figure 9:
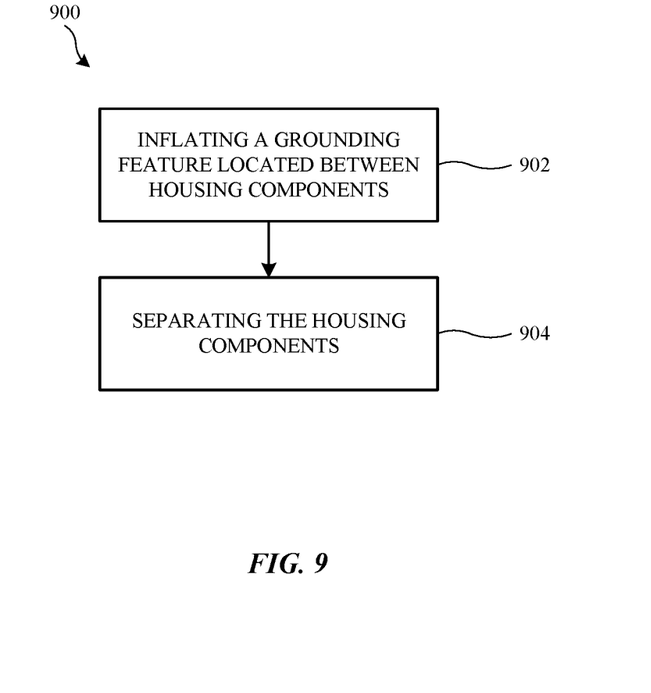
FIG. 9 shows a flow diagram describing an exemplary method for separating housing components using an expandable grounding feature according to various embodiments of the present disclosure.

FIG. 9 shows flow diagram 900 describing an exemplary method for separating housing components using an expandable grounding feature. In some embodiments, assembled housing components can lack exterior provisions for grasping and separating the housing components. In step 902, an expandable grounding feature between housing components can be inflated to exert an expansion force against the housing components. The expandable grounding feature can be any of those which are described above, for example, and can further be configured to accept re-insertion of the fluid or other expansion element when in a collapsed state. In some embodiments, the expansion element can be a fluid, such as air. The expandable grounding feature can expand between housing components, exerting a separation, or expansion, force between the housing components. In the event that no compressive force is being exerted, the expansion force can cause the housing components to move away from one another in the region of the expanded grounding feature. The separation distance can expose provisions for grasping one or more of the housing components. In step 904, the housing components are separated, such as by grasping one or more the exposed provisions. By separating the housing components, maintenance and repairs can be performed on the housing sections or internal components.

For the foregoing flow diagrams, it will be readily appreciated that not every step provided is always necessary, and that further steps not set forth herein may also be included. For example, added steps that involve aligning the grounding feature with contact surfaces on the housing components may be added. Also, steps that provide more detail with respect to designing and forming the grounding feature may also be added, as well as steps that involve connecting various components to the electrical ground path. Furthermore, the exact order of steps may be altered as desired, and some steps may be performed simultaneously.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed.

It will be apparent to one of ordinary skill in the art that many modifications and variations are possible in view of the above teachings.

What is claimed is:

1. An electronic device, comprising:
a first housing component having a first contact surface;
a second housing component coupled to the first housing component to form an interior cavity of the electronic device therebetween, the second housing component having a second contact surface; and
an electrical grounding feature providing a ground path and located between the first and second housing components at the first and second contact surfaces, the electrical grounding feature including an outer portion formed from an electrically conductive material and forming an internal volume,
wherein an expanded state of the electrical grounding feature comprises the internal volume filled with a non-gaseous removable expansion element that causes the electrical grounding feature to apply an expansion force against the first and second housing components, preventing collapse of the grounding feature, and
wherein a compressed state of the electrical grounding feature comprises the non-gaseous removable expansion element absent from the internal volume of the electrical grounding feature and the internal cavity of the electronic device, such that the electrical grounding feature applies a near-zero expansion force against the first and second housing components, permitting collapse of the grounding feature.

2. The electronic device of claim 1, wherein the non-gaseous removable expansion element is removed from the interior cavity of the electronic device through an opening on one of the housing components.

3. The electronic device of claim 1, wherein the expansion force preventing collapse counteracts a compressive force exerted on the electrical grounding feature by the first and second housing components.

4. The electronic device of claim 1, wherein the electrical grounding feature communicates with an external environment via an opening in the electronic device and the non-gaseous removable expansion element is removed from the internal volume via the opening.

5. The electronic device of claim 1, further comprising:
an adhesive material coupling the electrical grounding feature to the first housing component at the first contact surface.

6. The electronic device of claim 5, wherein the adhesive material is electrically conductive.

7. The electronic device of claim 5, wherein the adhesive material is pressure sensitive.

8. The electronic device of claim 5, the adhesive material further coupling the electrical grounding feature to the second housing component at the second contact surface.

9. The electronic device of claim 1, wherein the non-gaseous removable expansion element comprises a foam material.

10. The electronic device of claim 9, wherein the foam material comprises a closed cell foam.

11. The electronic device of claim 9, wherein surface contact increases between the first contact surface and the outer portion formed from an electrically conductive material due to compression on the electrical grounding feature from the first and second housing components.

12. The electronic device of claim 1, wherein the outer portion of the electrical grounding feature is tubular and configured to allow the non-gaseous removable expansion element to be removed at an open distal end thereof.

13. The electronic device of claim 1, wherein the outer portion of the electrical grounding feature is formed from an elastic material.

14. The electronic device of claim 13, wherein the outer portion of the electrical grounding feature is configured to exert a near-zero expansion force on the first and second housing components when the electronic device is assembled and the non-gaseous removable expansion element is removed from the internal volume.

15. A method of forming a computing device, the method comprising:
exerting, in an expanded state of a grounding feature, a compressive force on the grounding feature that is located in an interior cavity formed between first and second housing components of the computing device, the grounding feature including a conductive outer material and defining an interior region, the expanded state comprising the interior region filled with a non-gaseous removable expansion element that causes a corresponding expansion force to be exerted from the grounding feature against the first and second housing components, preventing collapse of the grounding feature, wherein the compressive force further facilitates a pressure sensitive conductive medium electrically coupling the first and second housing components; and
removing the non-gaseous removable expansion element from the interior region of the grounding feature and the interior cavity of the computing device such that the grounding feature enters a compressed state, the compressed state comprising the grounding feature exerting a near zero expansion force against the first housing component and the second housing component, permitting collapse of the grounding feature, and
wherein the grounding feature forms a ground path between the first housing component and the second housing component.

16. The method of claim 15, wherein the grounding feature deforms during the compressed state such that the conductive outer material conforms to a contact surface of the first housing component.

17. The method of claim 15, further comprising:
assembling the first and second housing components, wherein the assembling results in the non-gaseous removable expansion element being removable from an exterior of the assembled first and second housing components via an opening in the computing device.

18. A computing device, comprising:
a first housing component;
a second housing component coupled with the first housing component to define an internal volume;
a grounding feature located between the first housing component and the second housing component, the grounding feature defining an interior volume; and
a layer of activated conductive pressure sensitive adhesive coupling the grounding feature to the first housing component,
wherein an expanded state of the grounding feature comprises the interior volume filled with a non-gaseous removable expansion element that causes the grounding feature to apply an expansion force preventing collapse of the grounding feature against the first and second housing components, and
wherein a compressed state of the grounding feature comprises the non-gaseous removable expansion element absent from the interior volume of the grounding feature and the internal volume of the first and second housing components, such that the grounding feature applies a near-zero expansion force permitting collapse of the grounding feature against the first and second housing components.

19. The computing device of claim 18, wherein the grounding feature further includes a tube shaped outer portion formed from a conductive flexible fabric.

20. The computing device of claim 18, wherein the non-gaseous removable expansion element comprises a non-compressible fluid.

* * * * *